United States Patent
Schuster et al.

(10) Patent No.: US 7,982,969 B2
(45) Date of Patent: Jul. 19, 2011

(54) PROJECTION OBJECTIVE OF A MICROLITHOGRAPHIC PROJECTION EXPOSURE APPARATUS

(75) Inventors: Karl-Heinz Schuster, Koenigsbronn (DE); Heiko Feldmann, Aalen (DE); Toralf Gruner, Aalen-Hofen (DE); Michael Totzeck, Schwaebisch Gmuend (DE); Wilfried Clauss, Tuebingen (DE); Susanne Beder, Aalen (DE); Daniel Kraehmer, Essingen (DE); Olaf Dittmann, Bopfingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 12 days.

(21) Appl. No.: 12/330,980

(22) Filed: Dec. 9, 2008

(65) Prior Publication Data

US 2009/0284831 A1 Nov. 19, 2009

Related U.S. Application Data

(63) Continuation of application No. PCT/EP2007/005297, filed on Jun. 15, 2007.

(60) Provisional application No. 60/814,385, filed on Jun. 16, 2006.

(51) Int. Cl.
*G02B 15/14* (2006.01)
(52) U.S. Cl. ........................................ 359/687
(58) Field of Classification Search ............ 359/687
See application file for complete search history.

(56) References Cited

U.S. PATENT DOCUMENTS

| 5,880,891 | A | 3/1999 | Fuerter |
| 2002/0023903 | A1* | 2/2002 | Ann Ngoi et al. ........ 219/121.68 |
| 2005/0225737 | A1* | 10/2005 | Weissenrieder et al. ........ 355/53 |
| 2006/0066962 | A1* | 3/2006 | Totzeck et al. ............... 359/819 |

FOREIGN PATENT DOCUMENTS

| DE | 196 16 922 | 10/1997 |
| EP | 0 724 199 | 7/1996 |
| EP | 0 937 999 | 8/1999 |
| WO | WO 2005/001527 | 1/2005 |
| WO | WO 2005/054954 | 6/2005 |
| WO | WO 2005/059618 | 6/2005 |
| WO | WO 2005/069055 | 7/2005 |
| WO | WO 2005/111689 | 11/2005 |
| WO | WO 2005/121899 | 12/2005 |

OTHER PUBLICATIONS

E. Delano, "First-order Design and the y, ëy Diagram", Applied Optics, 1963, vol. 2, No. 12, pp. 1251-1256.

(Continued)

*Primary Examiner* — Ricky L Mack
*Assistant Examiner* — James R Greece
(74) *Attorney, Agent, or Firm* — Fish & Richardson P.C.

(57) ABSTRACT

A projection objective of a microlithographic projection exposure apparatus has a high index refractive optical element with an index of refraction greater than 1.6. This element has a volume and a material related optical property which varies over the volume. Variations of this optical property cause an aberration of the objective. In one embodiment at least 4 optical surfaces are provided that are arranged in at least one volume which is optically conjugate with the volume of the refractive optical element. Each optical surface comprises at least one correction means, for example a surface deformation or a birefringent layer with locally varying properties, which at least partially corrects the aberration caused by the variation of the optical property.

47 Claims, 9 Drawing Sheets

OTHER PUBLICATIONS

H. Hammer et al., "Reconstruction of spatially inhomogeneous dielectric tensors through optical tomography", J. Opt. Soc. Am. A, vol. 22, No. 2, Feb. 2005, pp. 250-255.

A. C. Kak and M. Slaney, "Principles of Computerized Tomographic Imaging", IEEE press, New York, 1987, which is also published on the Internet at http://www.slaney.org/pet/.

* cited by examiner

PROJECTION OBJECTIVE OF A MICROLITHOGRAPHIC PROJECTION EXPOSURE APPARATUS

CROSS-REFERENCE TO RELATED APPLICATIONS

This application is a continuation of international application PCT/EP2007/005297, filed Jun. 15, 2007, which claims benefit of U.S. provisional application Ser. No. 60/814,385 filed Jun. 16, 2006. The full disclosure of these applications are incorporated herein by reference.

FIELD

The disclosure generally relates to a projection objective of a microlithographic projection exposure apparatus, as well as related components, apparatus and methods. Such apparatus can be used, for example, in the production of integrated circuits and other microstructured components. As an example, the disclosure relates to a projection objective having a refractive optical element that has a material related optical property (e.g. the refractive index or the birefringence) which varies over the volume of the element.

BACKGROUND

Integrated electrical circuits and other microstructured components are conventionally produced by applying a plurality of structured layers onto a suitable substrate which, for example, may be a silicon wafer. In order to structure the layers, they can be first covered with a photoresist which is sensitive to light of a particular wavelength, for example 248 nm, 193 nm or 157 nm. The wafer coated in this way can be subsequently exposed in a projection exposure apparatus. During the exposure, a pattern of structures on a mask can be projected onto the photoresist with the aid of a projection objective. Since the imaging scale is generally less than 1, such projection objectives are often referred to as reduction objectives.

After the photoresist has been developed, the wafer can be subjected to an etching process so that the layer becomes structured according to the pattern on the mask. The photoresist still remaining can then be removed from the other parts of the layer. This process can repeated until all the layers have been applied on the wafer.

SUMMARY

In some instances, it is desirable to provide a projection exposure apparatus designed to lithographically define structures with smaller and smaller dimensions on the wafer. Small structures can lead to high integration densities, which can generally have a favorable effect on the performance of the microstructured components produced with the aid of such apparatus.

In many instances, the minimum size of the structures depends primarily on the resolution of the projection objective. Because the resolution of projection objectives is generally proportional to the wavelength of the projection light, one way of decreasing the resolution can be to use projection light with shorter and shorter wavelengths. Often, the shortest wavelengths currently used are in the deep ultraviolet (DUV) spectral range and are equal to, for example, 193 nm, or occasionally even 157 nm.

In certain instances, the resolution is inversely proportional to the numerical aperture on the object side of the projection objective. In such instances, a way of decreasing the resolution can be based on the idea of introducing an immersion liquid with a high refractive index into an immersion space, which remains between a last optical element on the image side of the projection objective and the photoresist or another photosensitive layer to be exposed. Projection objectives which are designed for immersed operation are commonly referred to as immersion objectives, and can often achieve numerical apertures of more than 1, for example 1.3 or 1.4.

Amorphous quartz glass or calcium fluoride ($CaF_2$) is conventionally used as a material for the last optical element on the image side of immersion objectives. At a wavelength $\lambda=193$ nm, quartz glass has a refractive index of approximately 1.56, and $CaF_2$ has a retractive index of approximately 1.50. Because the refractive index of the last optical element on the image side can limit the numerical aperture of the immersion objective, the use of materials with an even higher refractive index is being considered particularly for the last lens on the image side of the projection objective. Certain fluorides such as barium fluoride ($BaF_2$) or lanthanum fluoride ($LaF_3$), certain chlorides such as sodium chloride (NaCl) or potassium chloride (KCl) or certain oxides such as magnesium spinel ($MgAlaO_4$), calcium spinel ($CaAl_2O_4$), yttrium aluminium garnet ($Y_3Al_5Oi_2$) or magnesium excess spinel ($MgOOAl_2O_3$) are envisaged, for example. However, many issues may still need to be addressed with respect to producing and processing such high-index optical materials. As an example, currently the homogeneity of certain optical properties of these materials (e.g., refractive index, birefringence, absorption and/or scattering) may be inferior to those of the amorphous and crystalline lens materials that are commonly used. Birefringence in the last optical element on the image side can be of particular interest because the projection light passes through this element with a particularly wide angle spectrum. But, in high-resolution immersion objectives, inhomogeneous and anisotropic optical properties in the last lens on the image side can cause undesirable aberrations, so that it may not be practical to readily use the new high-index materials.

In some aspects, the disclosure provides a projection objective of a microlithographic projection exposure apparatus in which aberrations caused by high-index optical materials are reduced.

In certain embodiments, the disclosure provides a projection objective of a microlithographic projection exposure apparatus that has a high index refractive optical element with an index of refraction greater than 1.6 at a wavelength of 193 nm. This optical element has a volume and a material related optical property which varies over the volume. Variations of this optical property cause an aberration of the objective. Optionally, at least 4 (e.g., at least 6, at least 8) optical surfaces are provided that are arranged in one continuous volume (or are distributed over a plurality of distinct volumes) which is optically conjugate with the volume of the refractive optical element. Each optical surface includes at least one correction mechanism (e.g., a surface deformation or a birefringent layer with locally varying properties) which at least partially corrects the aberration caused by the variation of the optical property.

The disclosure is based, at least in part, on the idea that a spatially inhomogeneous optical property can be corrected successfully by providing a spatially well-resolved conjugate volume, in which a suitable correction mechanism are arranged.

In order to determine the position and placement of the correction mechanism, the refractive optical element may initially be subdivided conceptually into a large number of small volume elements. In another step, the relevant optical property (or several optical properties) is determined for the volume element. In a further step, the place where these volume elements are imaged into another portion of the objective is determined, and an overall volume conjugate with the volume of the refractive optical element is thus determined.

If the refractive optical element is the last element on the image side, there is generally at least one conjugate volume between the illumination system and the mask plane. In such instances, it may be possible to achieve only a limited, angle-independent correction of aberrations which are caused by inhomogeneous refractive index distributions. It may therefore be desirable to have at least one intermediate image in the projection objective. In front of such an intermediate image, there is a further conjugate volume in which the correction mechanism can be arranged. Those aberrations, which are caused by inhomogeneities of angle-dependent optical properties, can then also be corrected by the correction mechanism.

A correction mechanism associated with a correction element is then determined so that it at least partially corrects a component of an aberration which is caused by the considered volume element in the last optical element.

In general, it may not be possible to accommodate an arbitrarily large number of optical surfaces in the volume conjugate with the refractive optical element. Therefore an optimization process may be carried out. A result of such a process may be that only a few surfaces having a correction mechanism remain that at least substantially correct the aberrations due to the inhomogeneities in the refractive optical element.

A high-index refractive optical element is defined in this context as a material having a refractive index at the wavelength of $\lambda=193$ nm of more than 1.6. For refractive elements having a refractive index significantly above that value, for example greater than 1.8 or even greater than 2.0, the present disclosure can be even more advantageous because such materials often have even greater variations of certain optical properties that cause aberrations in the projection objective.

In many cases, such a high-index refractive optical element is the last optical element of the objective, because, when the optical element is so positioned within the objective, it can have a particularly advantageous effect on the numerical aperture NA of the projection objective. Typically, the refractive optical element then has at least one curved surface, often on its object side. If the objective is designed for immersion operation, during which an immersion liquid at least partially covers a photosensitive layer which is arranged in an image plane of the objective, the refractive optical element may contact the immersion liquid during the immersion operation.

If the undesired variations of the optical property are distributed over the entire volume of the refractive optical element, it may be advantageous to have conjugate surfaces arranged in the volume of the refractive index that are spaced apart (e.g., by less than 5 mm, by less than 2.5 mm) in a direction parallel to an optical axis of the objective. This can help ensure sufficient spatial resolution so that a defect in the material of the refractive optical element which has dimensions in the millimeter range can be successfully addressed.

The inhomogeneous optical properties considered here include, but are not limited to, the refractive index, the birefringence, the degree of absorption and/or the amount of scattering.

In order to correct a wavefront deformation which is caused by an inhomogeneous refractive index distribution in the refractive element, at least one of the optical surfaces may have a correction mechanism formed as a non-axis symmetric deformation of the at least one optical surface. The deformation can be configured to correct a wavefront deformation associated with the aberration. Such a surface deformation may be produced by locally applying a material to the at least one optical surface, and/or by locally ablating application material from the at least one optically surface.

In order to correct a spatially inhomogeneous birefringence, it is generally desirable for the correction mechanism to modify the state of polarization of light passing through it. To this end the correction mechanism may include structures made of a birefringent material, such as layers or plates having thicknesses that vary locally over the optical surface that having the at least one correction mechanism. Additionally or as an alternative, it is possible to use form-birefringent structures for the at least one correction mechanism.

If the inhomogeneous optical property is the degree of absorption, for example, the at least one optical surface may have a correction mechanism formed by a portion of the at least one optical surface, or a volume adjacent to the at least one optical surface, having a locally varying transmissivity or reflectivity.

If the inhomogeneous optical property is the amount of scattering light, for example, the at least one optical surface may have a correction mechanism formed by a portion of the at least one optical surface, or a volume adjacent to the at least one optical surface, having a locally varying scattering effect. For example, within a portion of the high-index refractive optical element the scattering may be higher than in surrounding portions. The correction mechanism may then be formed by a surface which has its smallest scattering effect in an area which is optically conjugate with the portion within the refractive optical element where an increased scattering occurs. In total, this would achieve a compensating effect. Different degrees of scattering may be produced, for example, by providing an optical surface having a locally varying surface roughness.

If the objective has N intermediate image surface and N+1 pupil surfaces, with N=0, 1, 2, . . . , the at least optical surface (e.g., the at least 4 optical surfaces) may be separated by k intermediate image surfaces and k pupil surfaces, with k=0, 1, 2, . . . , N.

This can help ensure that light bundles passing through the conjugate volume elements are not inverted by an odd number of pupil or intermediate image planes.

In some embodiments, several different types of correction mechanism can be used. The different types of correction mechanism can correct aberrations that are generated by inhomogeneities of several or all of the aforementioned optical properties, and/or optical properties that are not explicitly mentioned here.

In principle, the optical surfaces including the correction mechanism may be formed on supports that have virtually any axisymmetric shape. Nevertheless, it can be particularly advantageous for one, several or all of the surfaces to be formed on plane-parallel plates. The plates may have different thicknesses and different distances from one another. Some or all of the plates may be arranged so that they are displaceable along an optical axis of the projection objective.

In some embodiments, it can be particularly desirable to form the surfaces on plane-parallel plates because during the optical design of the immersion objective it is possible to provide just one single thick plate initially, which is divided into a plurality of individual plates during the subsequent optimization. The division into a plurality of optionally displaceable individual plates does not change the optical effect, or changes it only slightly, so that the other optical elements of the immersion objective do not need to be adapted, or need to be adapted only slightly. Furthermore, non-axisymmetric surface deformations, which are suitable for the correction of wavefront deformations, can locally be produced particularly advantageously on plane-parallel plates.

Optionally, a plurality of thinner plates may be provided. Such plates can be displaced along the optical axis without significantly affecting the optical properties of the projection objective.

In both cases, the design of the projection objective is greatly facilitated, because it is possible to start with an initial design including one single thick plate, or a plurality of thinner plates, and to position the thinner plates (in the case of the thicker plate after conceptually dividing it into two or more thinner plates) at the appropriate axial positions without altering the initial design otherwise.

In order to allow adaptation to different operating states, for example different illumination angle distributions or different masks, one or more plates may be held in an exchange holder. Because both the illumination angle distribution and the mask usually affect the positions where the light rays pass through the refractive optical element, when changing the illumination angle distribution and/or the mask it may be expedient to employ plates whose correction mechanism are specially adapted to the portions of the refractive optical element through which the projection light actually passes. Furthermore, the optical properties of the refractive optical element may change as a result of photoinduced degradation phenomena in the course of operating the apparatus, so that adaptation of the corrective effect may likewise be desirable.

The optical surfaces including the correction mechanism(s) do not necessarily have to be arranged adjacent to one another. In many cases it will be more advantageous to separate the surfaces by at least one lens or other optical element which does not correct the aberration(s).

In certain embodiments, the disclosure provides a method of designing a projection objective of a microlithographic exposure apparatus. The method includes:
a) determining an initial design of the objective, wherein the initial design includes
  a refractive optical element and
  at least 2 transparent plane-parallel correction plates which can be conceptually shifted along an optical axis of the objective such that they are at least partially arranged in a conjugate volume which is devoid of any optical elements and which is optically conjugate with the total volume of the high index refractive optical element;
b) determining a volume element in the refractive optical element in which a material related optical property varies, wherein a variation of the optical property in the volume element causes an aberration;
c) determining a conjugate volume element which is optically conjugate to the volume element determined in step b) and which is located in the conjugate volume being devoid of any optical elements;
d) conceptually positioning at least one of the correction plates such that a surface of the at least one plate is arranged in the conjugate volume element determined in step c); and
e) designing a correction mechanism at the surface of the at least one correction plate that at least partially reduce the aberration.

It should be noted that the least 2 transparent plane-parallel correction plates mentioned in step a) may also be conceptually considered as forming a single thicker plane-parallel correction plate which may be divided in two ore more individual plates as desired.

The details of one or more embodiments of the disclosure are set forth in the accompanying drawings and the description below. Other features and advantages of the disclosure will be apparent from the description and drawings, and from the claims.

DESCRIPTION OF DRAWINGS

Various features and advantages of the disclosure may be more readily understood with reference to the following detailed description taken in conjunction with the accompanying drawing in which.

DETAILED DESCRIPTION

Figure 1:
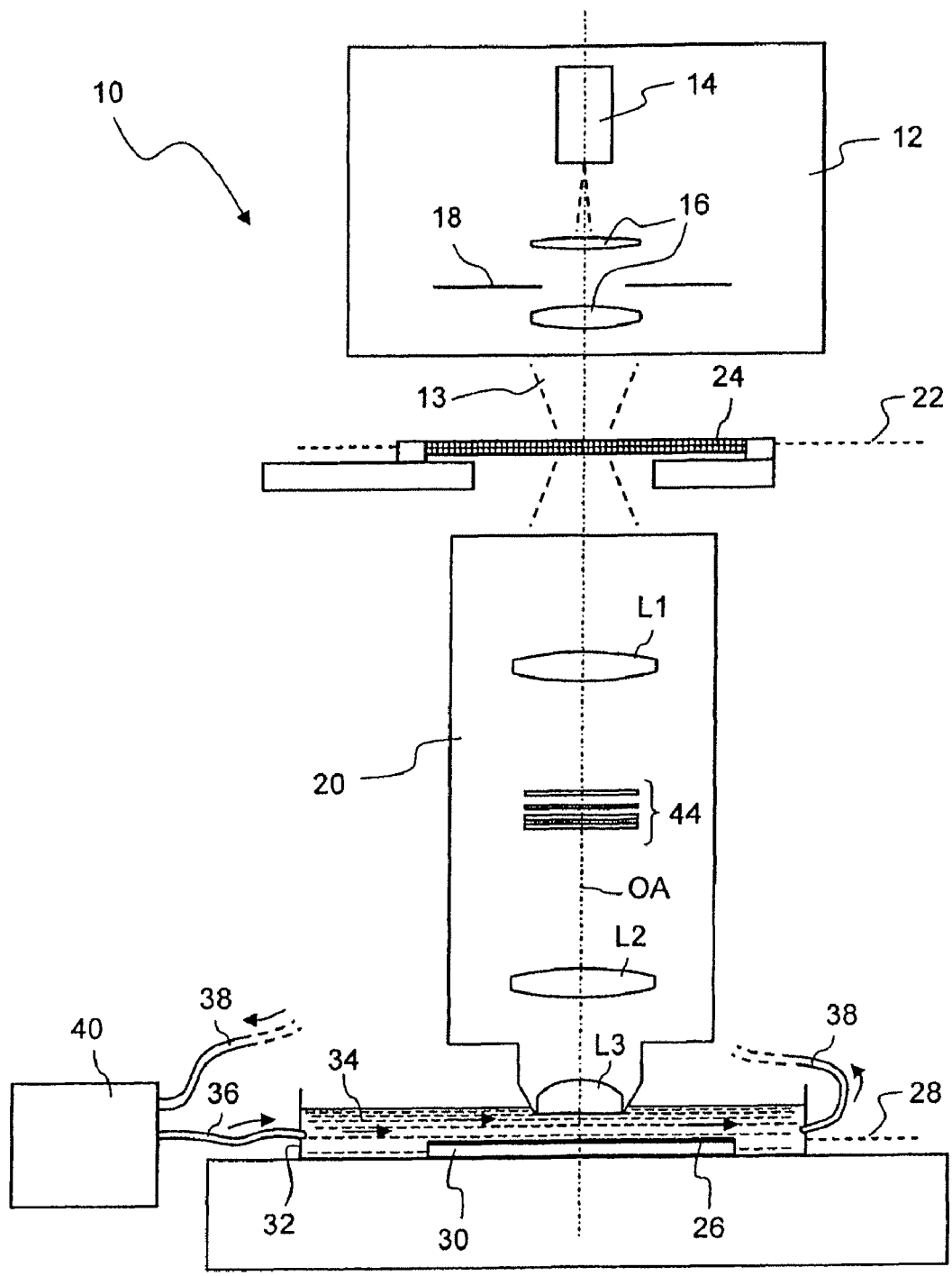
FIG. 1 is a schematic meridional section through a projection exposure apparatus having a projection objective.

FIG. 1 is a schematic meridional section through a microlithographic projection exposure apparatus which is denoted in its entirety by 10. The projection exposure apparatus 10 includes an illumination system 12 for generating projection light 13, which includes a light source 14, illumination optics indicated by 16 and a field stop 18. In the embodiment shown the projection light has a wavelength of 193 nm. As a matter of course, other wavelengths, for example 157 nm or 248 nm, are also contemplated.

The projection exposure apparatus 10 furthermore includes a projection objective 20 which contains a plurality of optical elements such as lenses, mirrors or filter elements. For the sake of simplicity, the projection objective 20 is shown with only three lenses L1, L2 and L3; more realistic embodiments of projection objectives are shown, for example, in FIGS. 6 and 7. The projection objective 20 is used to image a mask 24, which is arranged in a mask plane 22 of the projection objective 20, onto a photosensitive layer 26 which, for example, may consist of a photoresist. The layer 26 is arranged in an image plane 28 of the projection objective 20 and is applied on a wafer 30.

In this embodiment the support 30 is fastened on the bottom of a trough-like, open-topped container 32 which can be displaced (in a way which is not represented in detail) parallel to the image plane 28 with the aid of a displacement device. The container 32 is filled with an immersion liquid 34 so that the projection objective 20 is immersed with its last lens L3 on the image side into the immersion liquid 34 during operation of the projection exposure apparatus 10.

Via a feed line 36 and a discharge line 38, the container 32 is connected to a treatment unit 40 which (e.g., in a manner which is known and therefore not represented in detail) contains a circulating pump, a filter for cleaning the immersion liquid 34 and a temperature control unit. It should be understood that other setups for immersing the projection objective 20 may be used instead. For example, the immersion liquid 34 may not be contained in a container, but may be directly released on and sucked off the photosensitive layer 26 (e.g., in a manner which is known).

Figure 2:
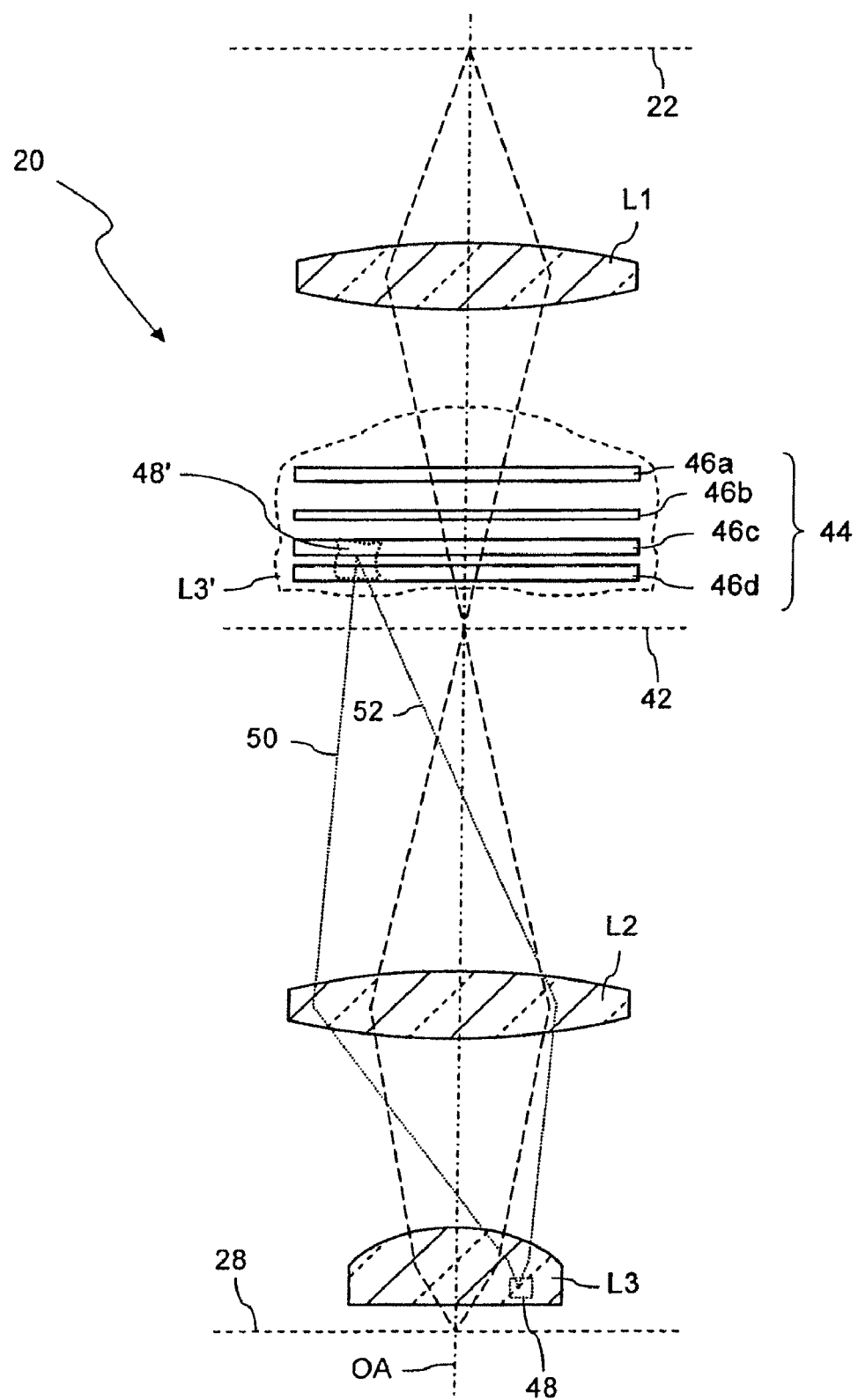
FIG. 2 is a highly schematic meridional section through the projection objective shown in FIG. 1.

FIG. 2 shows the projection objective 20 of FIG. 1 in an enlarged schematic representation. There it can be seen that the lens L1 images the mask plane 22 onto an intermediate image plane 42. The image of the mask 24 formed in this intermediate image plane 42 may be affected by significant aberrations. The lenses L2 and L3 image the intermediate image 42 onto the image plane 28. The mask plane 22, the intermediate image 42 and the image plane 28 are therefore optically conjugate with one another.

Light rays which emerge from a point of the mask plane 22 converge via the aberration-affected intermediate image at a point in the image plane 28.

The last lens L3 on the image side is a plano-convex lens in the embodiment shown; other lens shapes, for example convex-concave or even plane-parallel, are of course also possible. In some embodiments, the last lens L3 on the image side is made of magnesium spinel ($MgAl_2O_4$).

It is believed that this is a lens material which, owing to insufficient optical homogeneity and purity, cannot yet be used in such projection objectives without the correction mechanism proposed hereinafter. One or more optical properties of the lens L3 therefore vary—albeit slightly—over the volume of the lens L3. This optical property may, for example, be the refractive index. Inhomogeneous refractive index distributions, which are also referred to as schlieren when they have a particularly short-wave profile, in turn cause wavefront deformations for the projection light passing through. In the case of optically anisotropic materials, a refractive index may still be defined as a scalar quantity, for example as an average value between the ordinary refractive index and the extraordinary refractive index.

In the case of optically anisotropic and therefore birefringent lens materials, the birefringence tensor may furthermore be a function of the position, so that equally polarized and mutually parallel rays experience a different change in their polarization state as a function of the position where they pass through the lens L3.

It is also possible that the lens L3 is not homogeneously transparent. Lens L3 can have a spatially varying transmission coefficient, or locally varying scattering properties.

The effect of all the inhomogeneities mentioned above is that the imaging of the mask 22 on the photosensitive layer 26 is perturbed by aberrations.

In order to correct these aberrations, a correction device 44, which includes four correction elements 46a, 46b, 46c, 46d in this embodiment, is arranged between the lens L1 and the intermediate image plane 42. The correction elements 46a, 46b, 46c, 46d are plane-parallel transparent plates, which can be rendered highly antireflective for the working wavelength of the projection exposure apparatus 10. As an alternative to this, the correction elements 46a, 46b, 46c, 46d may also adjoin a liquid on one or both sides, in order to reduce undesired light reflections. Details of the structure of the correction elements 46a, 46b, 46c, 46d will be explained in more detail below with reference to FIG. 3.

The correction elements 46a, 46b, 46c, 46d of the correction device 44 are indicated inside a volume L3', which is conjugate with the volume of the last lens L3 on the image side.

The thickness, the placement and the design of the correction elements 46a, 46b, 46c, 46d may be determined in accordance with the following method:

First, the optical properties of the last lens L3 on the image side are measured with three-dimensional position resolution. This measurement may for example be carried out on a cylindrical lens preform, onto which the lens geometry is transferred computationally. During the subsequent production of the lens and the computational transfer of the data obtained with the aid of the preform onto the lens, particular attention is to be paid to the azimuthal placement and orientation of the outer faces of the crystal. A spatial accuracy of less than 100 μm between the measurement data from the crystal, on the one hand, and the production of the lens and the replication in the computer, on the other hand, is expedient. Suitable methods for this are of the tomographic type. A re-view of these can be found in the book by A. C. Kak and M. Slaney entitled "Principles of Computerized Tomographic Imaging", IEEE press, New York, 1987, which is also published on the Internet at http://www.slaney.org/pct/. A tomographic method for determining the birefringence distribution is described in an article by H. Hammer et al. entitled "Reconstruction of spatially inhomogeneous dielectric tensors through optical tomography", J. Opt. Soc. Am. A, vol. 22, No 2, February 2005, pages 250 to 255. The full disclosure of these two publications is incorporated herein by reference.

In a next step, the volume occupied by the last lens L3 on the image side is subdivided into a multiplicity of volume elements with homogeneous optical properties, the refractive index n of the volume elements being dependent on the respective position of the volume element in the lens L3. If the material is an optically anisotropic material, then each volume element may furthermore or alternatively be assigned a refractive index ellipsoid whose spatial orientation indicates the direction of the birefringence and whose ratio of major to minor symmetry axes corresponds to the magnitude Δn of the birefringence. Each volume element may furthermore or alternatively be assigned a transmission coefficient and/or a quantity describing the scattering properties as an additional scalar quantity. In FIG. 2, by way of example, a single volume element (here in the shape of a cube) is indicated by dotted lines and denoted by 48.

Figure 11:
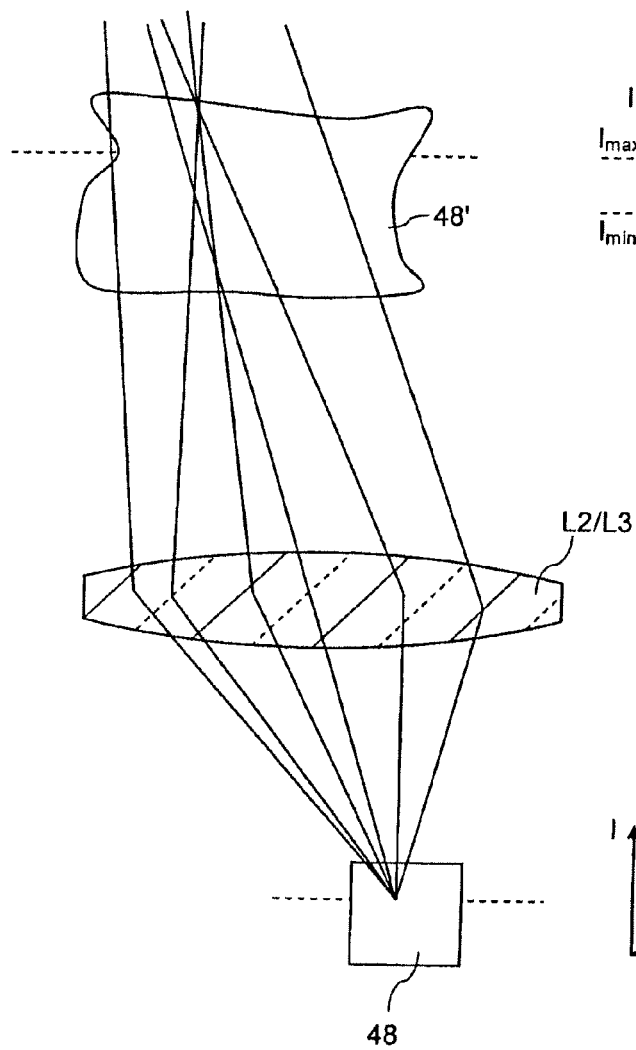
FIG. 11 is a schematic meridional section through a portion of a projection objective configured to illustrate the imaging of conjugate volumes within the projection objective.

In a further step, each volume element is assigned a conjugate volume element inside the conjugate volume L3'. For the volume element 48 in the last lens L3 on the image side in FIG. 2, the volume element conjugate therewith is denoted by 48'. Each volume element is imaged by the lens L2, and the part of the lens L3 contributing to the imaging, onto a conjugate volume element; the imaging scale may in this case vary laterally and longitudinally. Distortion-free imaging is not actually necessary. The forming of a distorted image of the volume element 48 is schematically illustrated in FIG. 11 which shows how light rays emerging from a point within the volume element 48 do not exactly meet at a single point within the conjugate volume element 48'. Furthermore, the projection light rays do in fact pass at different angles through the volume element 48 in the lens L3 than through the conjugate volume element 48', as is indicated by rays 50, 52 in FIG. 2. Nevertheless, for at least partial correction of aberrations it is merely sufficient that the same rays pass both through the conjugate volume element 48' and the volume element 48 in the lens L3.

Figure 12:
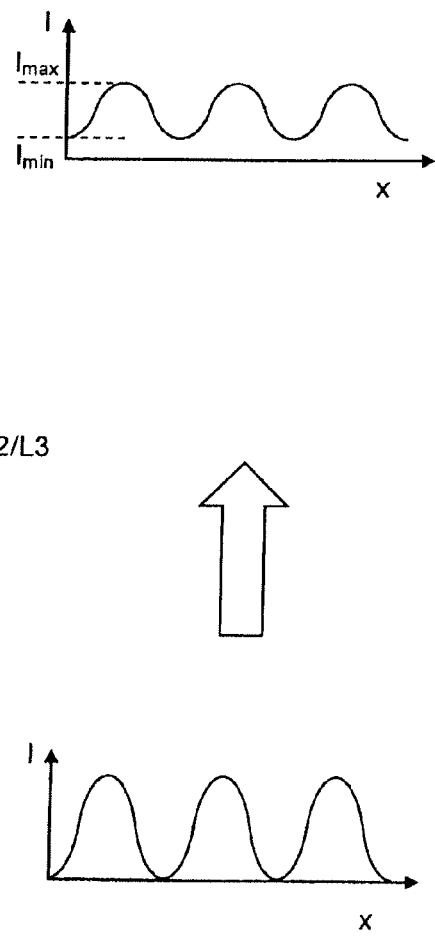
FIG. 12 are graphs showing how the optical transmission contrast in conjugated volumes shown in FIG. 11 decreases.

FIG. 12 illustrates that, as a result of the distorted image formed of the volume element 48, the transmission contrasts $T=(I_{max}-I_{mn})/(I_{max}+I_{min})$ decreases if an object, here an object assumed to have a sinusoidal intensity distribution perpendicular to the optical axis and to have a spatial frequency $F_s$, is incoherently imaged from the volume element 48 into the conjugate volume element 48'. For a good correction effect the contrast T should be at least 30% for a spatial frequency $F_s$=0.5 line pairs for millimeter (Lp/mm) (e.g., for a spatial frequency of $F_s$=0.7 Lp/mm, for a spatial frequency of $F_s$=1.0 Lp/mm).

Since the Petzval sum for the imaging may also be nonzero, plane sections in the last lens L3 may be imaged with arbitrary and even varying curvatures in the conjugate volume L3'. For this reason, the boundary of the conjugate volume element 48' in FIG. 2 is not cube-shaped, but irregularly curved. The lens L2, which generally represents a more complex optical system, is configured so that the tangential and sagittal image shells have almost the same shape and, in conjunction with oblique spherical aberration, allow to some extent a uniform image position both in tangential and sagittal direction.

It is readily possible to determine the conjugate volume elements with the aid of those known simulation programs which are used in the development of complex optical systems. It is, however, to be understood that the subdivision of the last lens L3 on the image side into volume elements has been selected here only for reasons of better representation. In a computational implementation of the method described above in a computer, it is simplest for the lens L3 to be represented as a three-dimensional grid network of support points, wherein to each point a set of optical properties measured at the relevant grid positions is assigned. This three-dimensional network of support points is then transformed into the conjugate volume L3' of the lens L3 with the aid of a transfer function, which describes the imaging of the optical elements lying in-between. A cubic grid then generally becomes a non-cubic grid of spatially blurred support points. Here, volume centroids can help to define an unambiguously correlated and distorted grid, despite aberrations of the intermediate image.

In a further step, the conjugate volume L3' of the last lens L3 on the image side in the object space is now filled virtually with a number N of plane-parallel plates. The N plates, which may have been provided also in an initial design of the projection objective 20, may adjoin one another without gaps. By virtual surface deformations of the N plates, an attempt is now made in a computer to correct the wavefront deformations which have been caused by different refractive indices in the volume elements in the last lens L3 on the image side. In order to achieve as complete a correction as possible, the number N of the plates should initially be selected to be quite large, for example N=20 or N=50.

An analysis is now made as to which of the N plates make no great contribution to the correction. These plates may have their surfaces removed and their optical thicknesses added to neighboring plates, or they are entirely removed, which may involve a slight adaptation of the other optical elements of the projection objective 20.

The latter case leads to an arrangement of plate-shaped correction elements, as shown by way of example and denoted by 46a, 46b, 46c, 46d in FIG. 2.

Instead of elements of different thickness, equally thick elements may also be arranged at different lengthwise positions along the optical axis OA. In the simplest case, all the correction elements are equally thick and are arranged at equal distances from one another.

It should be noted that, in order to be able to address variations in all portions of the last lens L3, the entire conjugate volume L3' is desirably devoid of any optical elements. This allows it to be possible to arrange at any arbitrary axial position a surface of a correction element. During the initial design of the projection objective 20, however, all correction plates 46a to 46d have to be taken into account in or in the vicinity of the conjugate volume L3'. Since a shift of the plane-parallel correction elements 46a to 46d along the optical axis does not alter their optical properties, the final axial positions of the correction element 46a to 46d may be determined once the variations of certain optical properties in the last lens L3 have been determined in the manner as described above.

Figure 3:
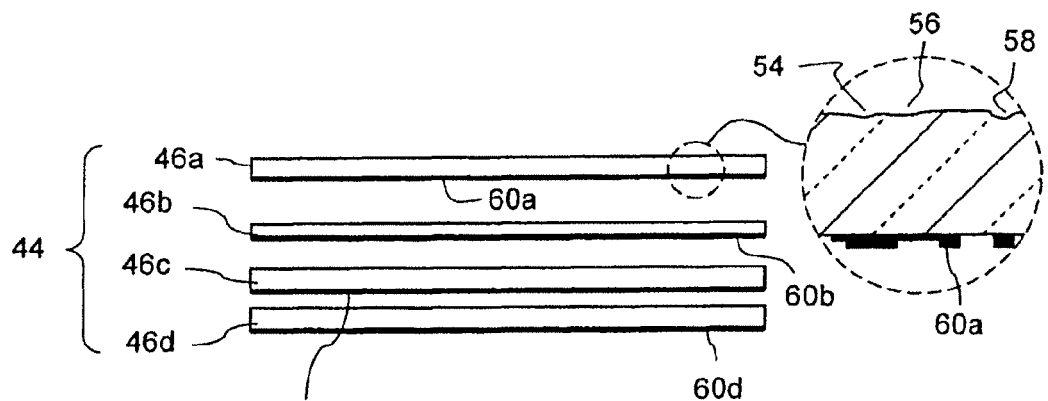
FIG. 3 is a side view of a correction device that may be arranged in the projection objective shown in FIG. 2.

In order to correct wavefront errors, one or both optical faces of each correction element 46a, 46b, 46c, 46d may be locally deformed using conventional techniques. In FIG. 3, in which the correction device 44 is shown on an enlarged scale, such local surface deformations can be seen on the upper side of the correction element 46a in the enlarged detail and are denoted by 54, 56 and 58.

If the last lens L3 on the image side is anisotropic, then, in a further optimization, the correction device 44 may be supplemented with structures by which undesired phase differences between orthogonal polarization states can be corrected. In FIG. 3, these structures are formed as birefringent layers and denoted by 60a, 60b, 60c and 60d. The birefringent layers 60a, 60b, 60c, 60d in the correction device 44 are applied on the lower side of the correction elements 46a, 46b, 46c and 46d and have a continuous or—as represented in the embodiment shown—discrete thickness distribution, which varies perpendicularly to the optical axis OA.

Figure 4:
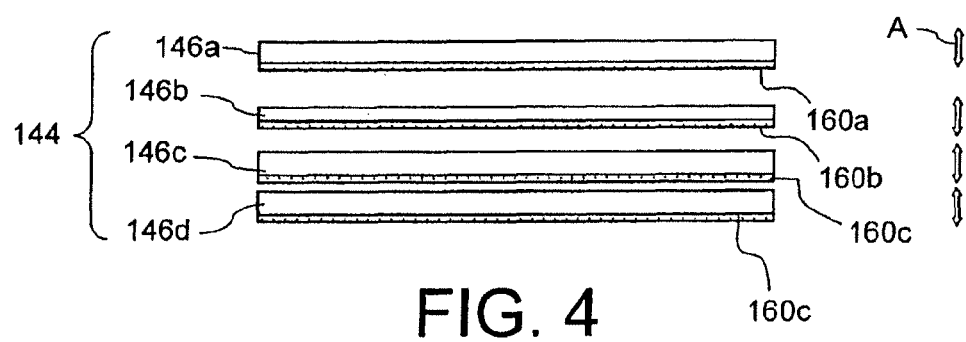
FIG. 4 is a side view of a correction device that may be arranged in the projection objective shown in FIG. 2.

FIG. 4. shows an embodiment of a correction device denoted by 144, in which the birefringent layers are replaced by form-birefringent structures 160a, 160b, 160c, 160d, which are likewise applied on the lower side of correction elements 146a, 146b, 146c and 146d. A differing birefringent effect can be achieved in the form-birefringent structures 160a, 160b, 160c, 160d by different dimensioning and arrangement of substructures that form the form-birefringent structures 160a, 160b, 160c, 160d.

Figure 5:
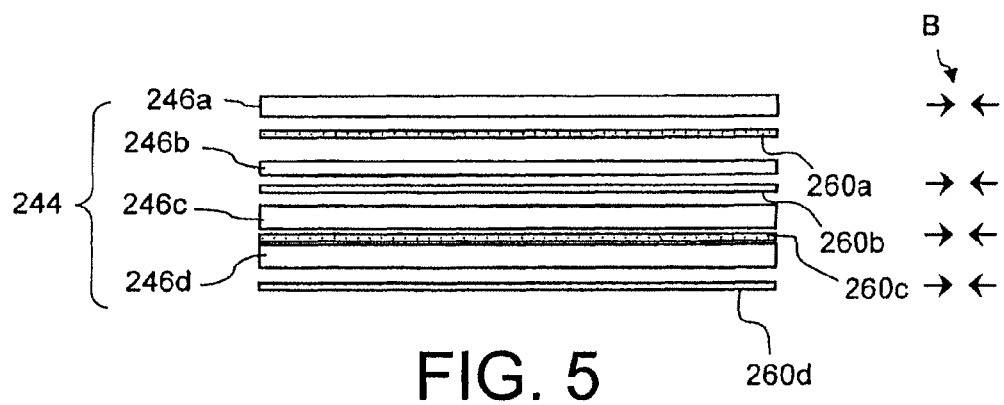
FIG. 5 is a side view of a correction device that may be arranged in the projection objective shown in FIG. 2.

FIG. 5 shows a correction device 244 according to another embodiment in which plates 260a, 260b, 260c, 260d for phase difference correction are arranged so that they are self-supporting between correction elements 246a, 246b, 246c, 246d.

Also for correcting the phase difference values, a very large number M of structures that modify the polarization state of light passing through may be assumed initially. In an optimization, those structures by which only a minor improvement of the imaging properties can be achieved are then gradually removed. The optimization desired for this is based not on scalar, but on vector calculations.

Thus, with the correction unit 44 it is possible to simultaneously achieve a scalar phase correction and also a vector phase difference correction in the conjugate volume 48'.

If it is (alternatively or additionally) desirable to correct aberrations which are caused by an inhomogeneous transmission coefficient in the last lens L3 on the image side, then it is possible to use reflective or refractive correction elements whose degree of transmission or reflection varies locally. The locally varying degree of transmission or reflection may in this case be accomplished by (anti-) reflective coatings.

In the correction device 144 shown in FIG. 4, vertically aligned arrows A indicate that the correction elements 146a, 146b, 146c, 146d, with the form-birefringent structures 160a, 160b, 160c, 160d applied thereon, can be displaced in a vertical direction by manipulators (not represented in detail). In this way, on the one hand, fine adjustment is possible. On the other hand, the correction device 144 may also be adapted retrospectively to modified optical properties in the last lens L3 on the image side. Such changes may, for example, be caused by degradation phenomena due to the energetic projection light 13.

In the correction device 244 shown in FIG. 5, horizontally extending arrows B indicate that the correction elements 246a, 246b, 246c, 246d can be removed from the beam path (in a manner not represented in detail) and replaced by other correction elements. In this way, even in the event of sizeable changes of the optical properties of the last lens L3 on the image side, it is possible to achieve a good correction by using other correction elements. Exchanging correction elements may be expedient also if the properties of the last lens L3 change during the life time of the projection objective 20.

In the embodiment shown in FIG. 2 it has been assumed that the correction elements 46a, 46b, 46c, 46d of the correction device 44 are arranged adjacent to one another in the volume L3', which is conjugate with the volume of the last lens L3 on the image side.

Figure 6:
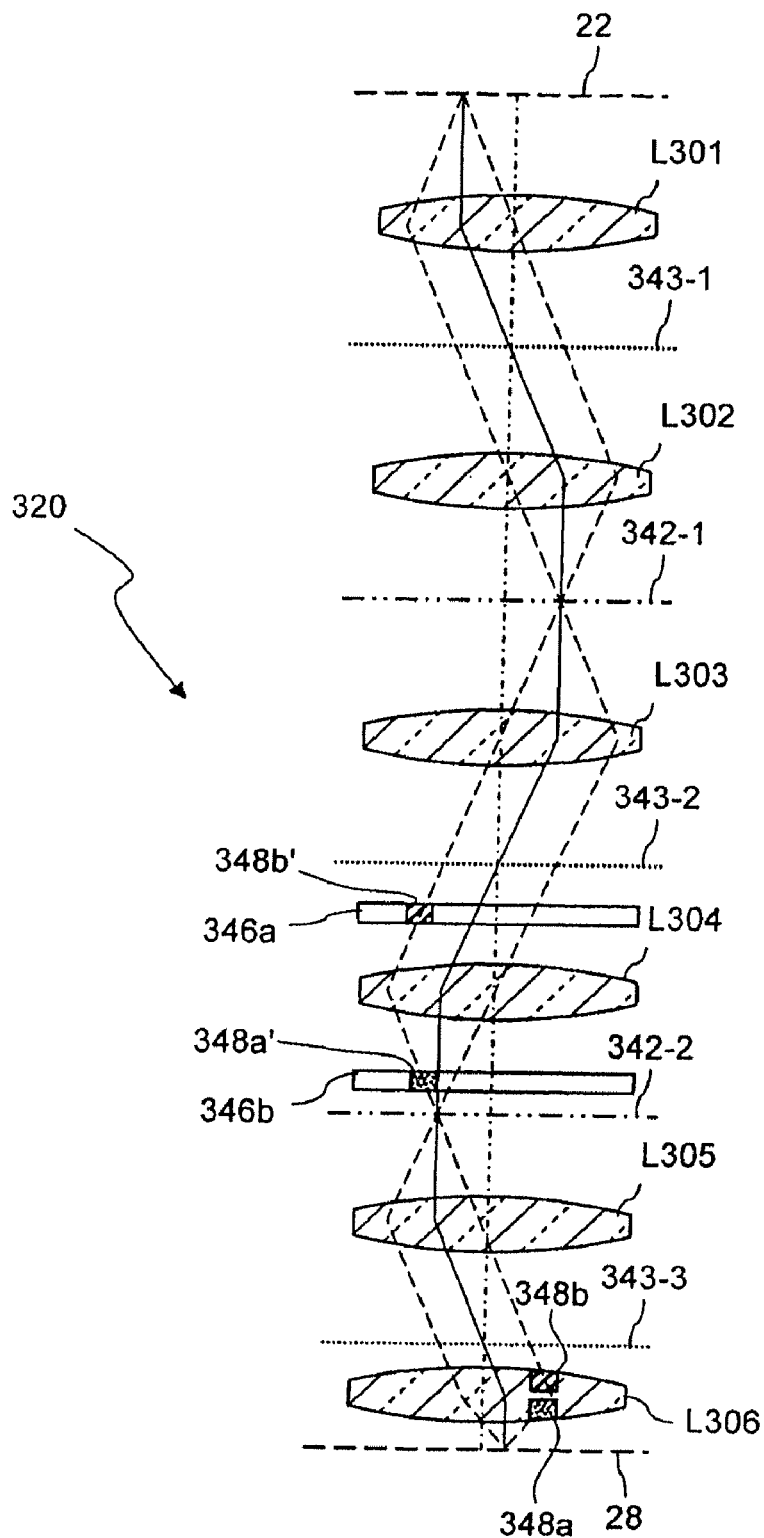
FIG. 6 is a schematic meridional section through a projection objective having two intermediate image surfaces.

FIG. 6 is a meridional section similar to FIG. 2. through a projection objective 320 according to another embodiment. The projection objective 320 has four field surfaces, namely the mask plane 22, a first intermediate image surface 342-1, a second intermediate image surface 342-2 and the image plane 28. Between pairs of adjacent field planes a first pupil surface 343-1, a second pupil surface 343-2 and a third pupil surface 343-3 are formed. Optical systems L301, L302, L303, L304, L305 and L306 represented by single lenses are arranged between adjacent field surfaces and pupil surfaces. The last optical system L306 may include several individual lenses as well, but optionally can contain only one curved lens, for example a plano-concave lens such as shown in FIG. 2, or a meniscus lens. As far as the general design of the projection objective 320 is concerned, the main difference to the projection objective 20 shown in FIG. 2 is that it contains one more intermediate image surface and one more pupil surface.

The intermediate image surfaces 342-1, 342-2 and the pupil surfaces 343-1, 343-2, 343-3 may be plane; generally, however, the surfaces are regularly or irregularly curved. With regard to the intermediate image surfaces 342-1, 342-2 it should be mentioned that the images formed in these surfaces may be subject to very significant aberrations. Realistic embodiments of a projection objective having two intermediate images will be described further below with reference to FIGS. 8 and 9.

As far as the correction elements are concerned, the projection objective 320 differs from the projection objective 20 shown in FIG. 2 in that two correction elements 346a, 346b formed by plane-parallel plates are arranged such that they are separated by other optical elements that do not contribute to the correction of aberrations produced by the optical system L306. The optical system L304 which is arranged between the two correcting elements 346a, 346b may consist of a single lens, or may include a plurality of lenses and/or other optical components such as mirrors.

In the last optical system L306 two volume elements 348a, 348b are schematically illustrated that are arranged at different distances from the image plane 28. Since the third pupil surface 343-3 is located in close proximity to the last lens system L306, the first volume element 348a is located closer to the image plane 28, and the second volume element 348b is located closer to the third pupil surface 343-3.

The same applies to the first and second conjugate volume elements 348a' and 348b' which are conjugate with the first volume element 348a and the second volume element 348b, respectively. More specifically, the first conjugate volume element 348a' is located inside the second correction element 346 which is arranged close to the second intermediate image surface 342-2. The second conjugate volume element 348b' is contained in the first correction element 346a, which is located closer to the second pupil surface 343-2.

Thus the volume elements 348a, 348b contained in the last lens system L306 have conjugate volume elements 348a', 348b' that are distributed over a larger portion of the projection objective 320. This is a consequence of the large angles occurring in the last lens system L306, because this implies that different volume elements within this particular lens system differ significantly with respect to their proximity to the image plane 28 and the third pupil surface 343-3. Namely, in volume elements which are located close to the image plane 28, light bundles pass through that converge towards a small area in the image plane 28. In other volume elements located closer to the object side surface of the last lens system L306, light bundles pass through that converge to image points which are distributed over a considerably larger area.

As a matter of course, additional correction elements may be provided, or optical components contained in the optical system L304 may be used as correction element. For example, optical surfaces of such optical components may be provided with non-rotationally symmetric surface deformations, or may support (form-) birefringent layers, as it has been explained above with reference to FIGS. 3 and 4.

Figure 7:
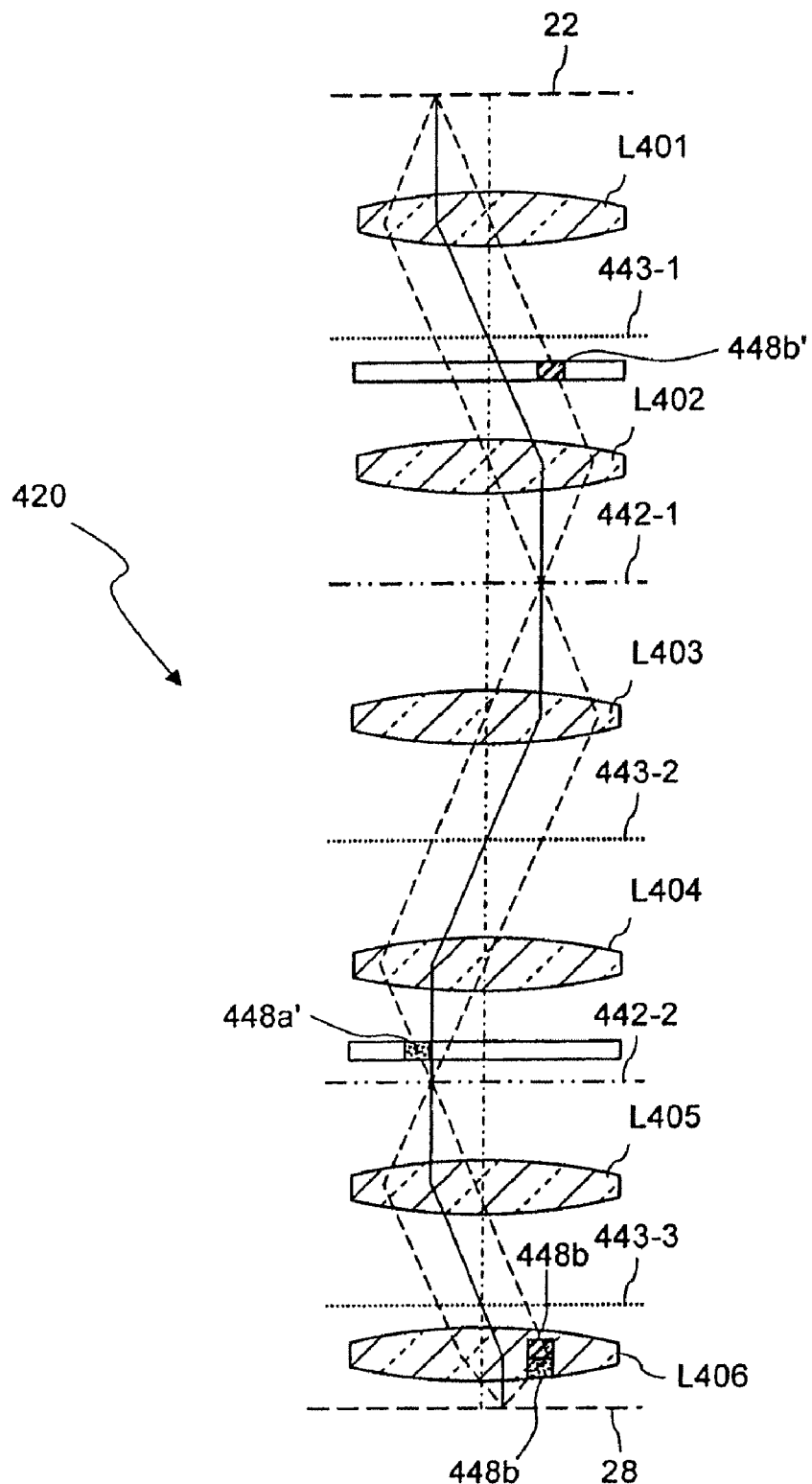
FIG. 7 is a schematic meridional section through a projection objective similar to the objective shown in FIG. 6, but with a different arrangement of correction plates.

FIG. 7 is a meridional section similar to FIG. 6, a projection objective 420 according to still another embodiment. In FIG. 7 components corresponding to those shown in FIG. 6 are denoted by the same reference numerals augmented by 100; most of these components will not be explained again. The projection objective 420 differs from the projection objective 320 shown in FIG. 6 only in that the first correction element 446a is not located in the vicinity of the second pupil surface 443-2, but in the vicinity of the first pupil surface 443-1. The second conjugate volume element 448b' is still optically conjugate with the second volume element 448b contained in the last lens system L406.

It should be noted that there are other conjugated volumes in the vicinity of a pupil surface which are not suitable for positioning a correction element which shall correct aberrations caused by the second volume element 448b. More specifically, conjugated volume elements have to be separated from a volume element in the last lens system L406 by k intermediate image surfaces and k pupil surfaces, with k=0, 1, 2, . . . , N and N being the total number of intermediate image surfaces. Otherwise only an inferior correction effect may be achieved, because each intermediate image surface and each pupil surface inverts the light bundle which emerges from a particular point in the mask plane 22 and converges to a conjugate point in the image plane 28. This is explained in more detail in U.S. Ser. No. 11/570,263 which corresponds to WO 2005/121899 A1 assigned to the applicant. The full disclosure of this earlier application is incorporated herein by reference. As a matter of course, the same considerations also apply to the other embodiments described above.

Figure 8:
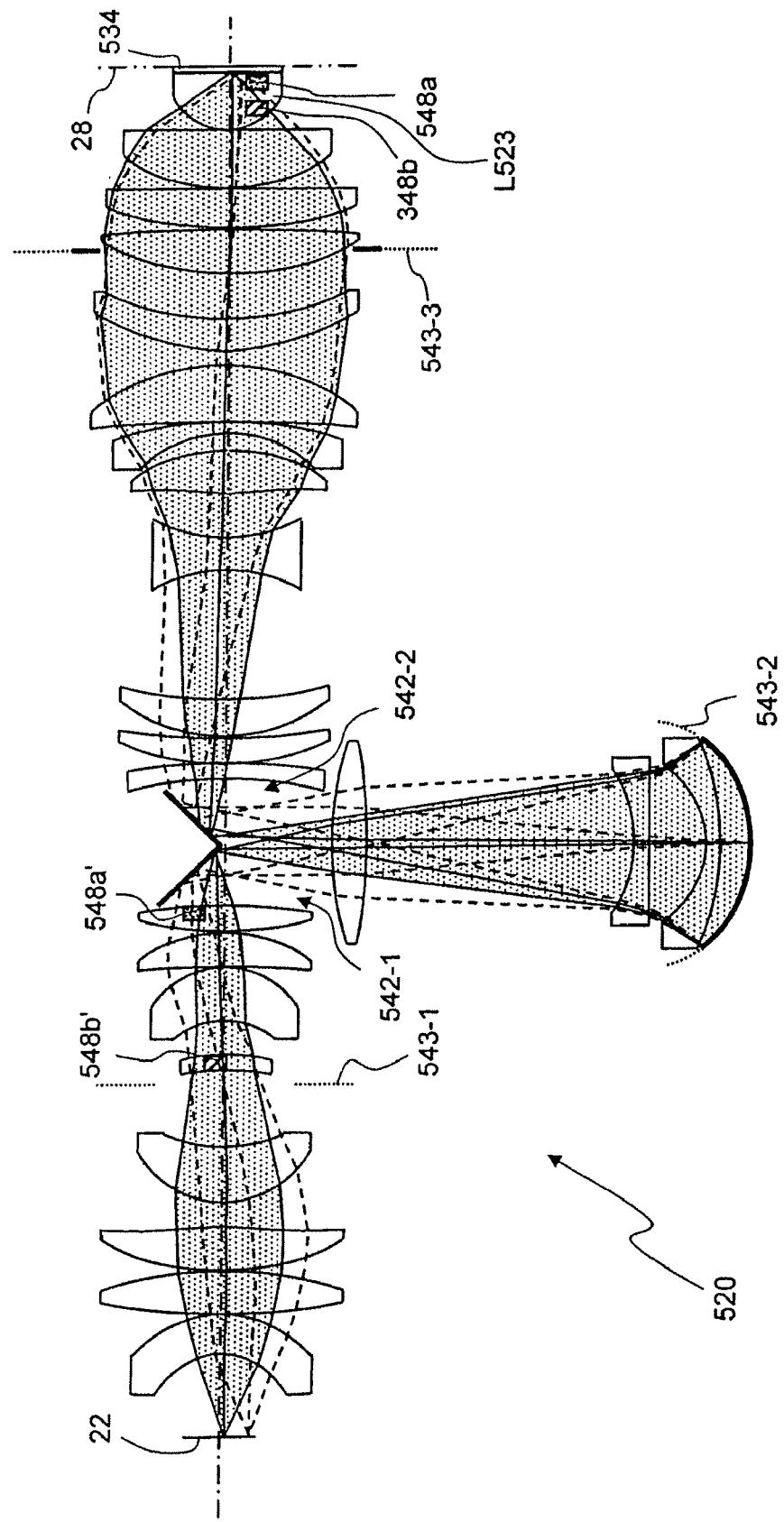
FIG. 8 is a meridional section through a projection objective having two intermediate image surfaces and three mirrors.

FIG. 8 is a meridional section through a realistic projection objective 520 which has, similar to the projection objective 320 shown in FIG. 6, two intermediate image surfaces 542-1, 542-2 and three pupil surfaces 543-1, 543-2 and 543-3. The last lens L523 is made of a CaF$_2$ crystal. Here it is assumed that this crystal has been grown in a cheap process so that it displays various crystal imperfections resulting in inhomogeneous material-related optical properties. This makes clear that the concepts described above may also be applied to lower index refractive optical elements having a poorer quality so that significant variations of certain optical properties occur within the volume of the optical element.

Volume elements 548a, 548b are schematically represented in the last lens L523 of the projection objective 520. Conjugated volume elements are denoted by 548a' and 548b'. In this particular embodiment the two conjugated volume elements 548a', 548b' are separated by two lenses. Furthermore, the volume elements 548a', 548b' are contained not in additional correction elements, but in lenses that are involved in accordance with the general design of the projection objective 520 anyway.

The projection objective 520 is designed as an immersion objective with a numerical aperture NA=1.2. This means that, during the operation of the projection exposure apparatus, the interspace between the last lens L523 and the image plane 28 is filled with an immersion liquid 534. The projection objective 520 is identical to the projection objective shown in FIG. 3 of WO 2005/111689 which is also assigned to the applicant.

Figure 9:
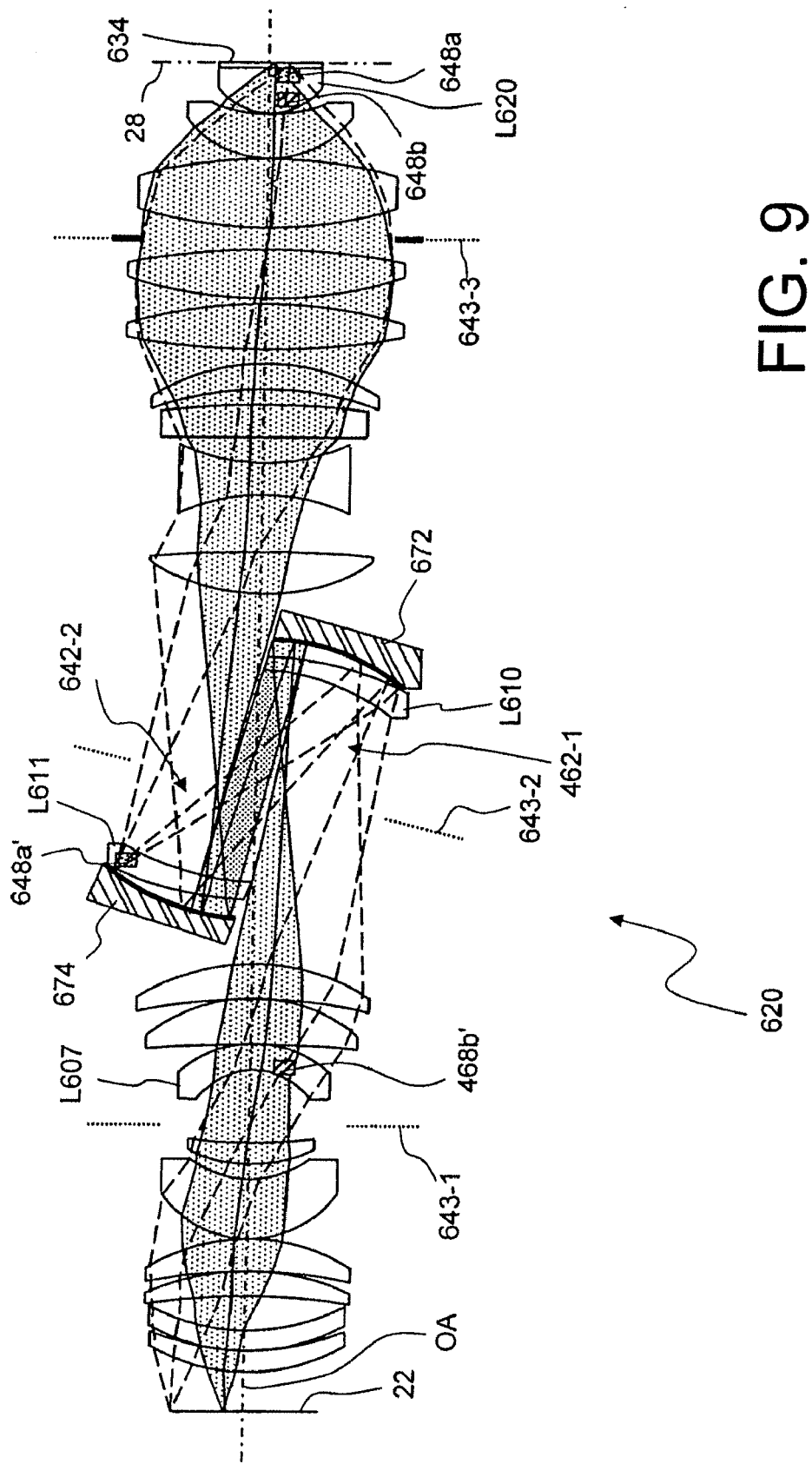
FIG. 9 is a meridional section through a projection objective having two intermediate image surfaces and two mirrors.

FIG. 9 is a meridional section through a realistic projection objective 620 according to a still further embodiment. The projection objective 620 is identical to the projection objective shown in FIG. 21 of WO 2005/069055 which is also assigned to the applicant.

The projection objective 620 has a first and a second intermediate image surface 642-1 and 642-2, respectively, and a first, a second and a third pupil surface 643-1, 643-2 and 643-3, respectively. The second pupil surface 643-2 is formed between two concave mirrors 672, 674, which have spherical surfaces and are arranged between the first and second intermediate image surfaces 642-1, 642-2 which are located in front of the mirrors 672, 674. Immediately in front of the mirrors 672, 674 negative meniscus lenses L610, L611 are positioned which are designed as truncated lens elements arranged only at the side of the optical axis OA of the projection objective 620 where the adjacent mirror 672 and 674, respectively, is positioned. Therefore the projection light passes each meniscus lens L610, L611 twice.

The projection objective 620 is designed as an immersion objective with a numerical aperture NA=1.2. This means that, during the operation of the projection exposure apparatus, the interspace between the last lens and the image plane 28 is filled with an immersion liquid 634.

With the exception of the last lens L620 all lenses are made of quartz glass. The last lens L620 is made of a [111] CaF$_2$ crystal. Here it is assumed again that this crystal has been grown in a cheap process so that it displays various crystal imperfections resulting in inhomogeneous material-related optical properties.

Conjugated volume elements 648a' and 648b' which are conjugate to volume elements 648a, 648b contained in the last lens L620 are contained in the truncated meniscus lens L611 and the lens L607, respectively. The overall configuration is thus similar to the projection objective 420 which has been described above with reference to FIG. 7.

In the following a very straightforward way to determine conjugated planes will be explained in more detail with reference to FIG. 10.

Figure 10:
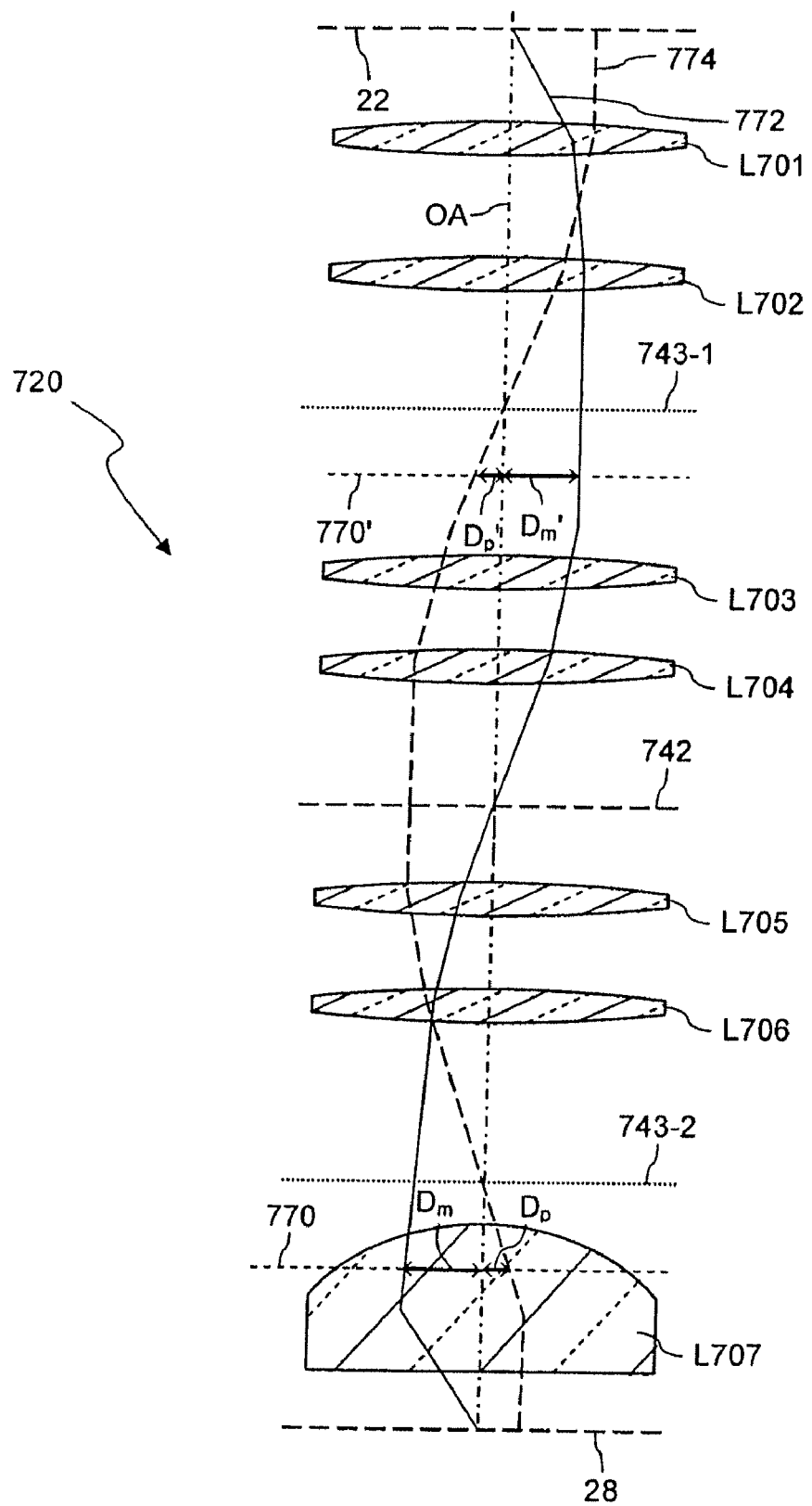
FIG. 10 is a schematic meridional section through a projection objective configured to illustrate the concept of conjugate planes.

FIG. 10 is a meridional section through a projection objective which is denoted in its entirety by 720. The projection objective 720 includes seven lenses L701 to L707 and has one intermediate image surface 742 and two pupil surfaces 743-1, 743-2.

The last lens L707 intersects a plane 770 indicated in broken lines. The projection objective 720 contains only one plane 770' which is optically conjugate with the plane 770. The precise axial position of this conjugate plane 110', which is arranged between the first pupil surface 743-1 and the intermediate image surface 742, may be determined pursuant a certain algorithm. This algorithm makes use of two specific rays, namely a marginal ray 772 and a principal ray 774. The marginal 772 is a ray which emerges from a point where the optical axis OA of the projection objective 720 intersects the mask plane 22. The principal ray 774 emerges from a point on the border of the field in the mask plane 22. The larger the field which can be imaged is, the further away from the optical axis OA is the point where the principal ray 774 emerges.

According to the algorithm mentioned above, the distances $D_m$ and $D_p$ between the optical axis OA on the one hand and the marginal ray 772 and the principal ray 774, respectively, on the other hand are determined at the axial position of the plane 770. Then the ratio $R=D_m/D_p$ is computed. Any plane conjugate with the plane 770 is characterized in that at its axial position the corresponding ratio $R'=D_m'/D_p'$ is identical (i.e. R=R'). In the projection objective 720 this is true for the conjugate plane 770'.

Since the projection objective 720 has only one intermediate image plane, there is only one conjugate plane for each plane intersecting the last lens L707. Consequently, there is only one continuous volume which is conjugate with the volume of the last lens L707. The axial extension of this conjugate volume is determined by the distance of planes which are conjugate with planes that intersect the vertices of the last lens L707. By repeating this algorithm for a plurality of planes intersecting the last lens L707, it is possible to axially resolve the volume of the last lens L707 with regard to the optical conjugation.

More information relating to the concept of conjugate planes and the constant ratio R may be gleaned from an essay E. Delano entitled: "First-order Design and the y,$\bar{y}$ Diagram", Applied Optics, 1963, vol. 2, no. 12, pages 1251-1256.

The above algorithm is, strictly speaking, only valid in the paraxial regime. Outside this regime, planes have only conjugated (generally curved) blurred surfaces, as it has been described further above.

The above description has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

The invention claimed is:
1. A projection objective comprising:
 a refractive optical element having a volume and a material related optical property that varies over the volume, and
  a plurality of optical surfaces that are arranged in a volume that is optically conjugate with the volume of the refractive optical element,
 wherein:
  variations of the material related optical property of the refractive index refractive optical element cause an aberration during use of the projection objective;

each of the plurality of optical surfaces comprises at least one correction mechanism that at least partially corrects the aberration; and the projection objective is configured to be used in a microlithographic projection exposure apparatus, wherein the at least one correction mechanism is located in or intersects a first plane perpendicular to an optical axis of the objective, the first plane is conjugate with a second plane perpendicular to the optical axis, and the second plane intersects the volume of the refractive optical element, and wherein a ratio R=Dp/Dm is at least substantially the same in the first and second planes, where:

Dp is a distance between a principal ray, which emerges from a point on a border of a field which is imaged by the objective, and the optical axis; and Dm is a distance between a marginal ray, which emerges from a point on the optical axis in the field which is imaged by the objective, and the optical axis.

2. The objective of claim 1, wherein a refractive index of the refractive optical element is greater than 1.8 at a wavelength of 193 nm.

3. The objective of claim 1 wherein the refractive optical element is a last optical element of the objective along a path of light through the objective.

4. The objective of claim 1, wherein the refractive optical element has at least one curved surface.

5. The objective of claim 1, wherein the objective is configured to be used in immersion operation, and the objective is configured so that during immersion operation an immersion liquid at least partially covers a photosensitive layer which is arranged in an image plane of the objective.

6. The objective of claim 5, wherein the refractive optical element contacts the immersion liquid during the immersion operation.

7. The objective of claim 1, wherein the plurality of optical surfaces comprises at least four optical surfaces.

8. The objective of claim 7, wherein each of the 4 optical surfaces comprises at least one correction mechanism that at least partially corrects the aberration.

9. The objective of claim 1, wherein the plurality of optical surfaces comprises at least 6 optical surfaces, and each of the 6 optical surfaces comprises at least one correction mechanism that at least partially corrects the aberration.

10. The objective of claim 1, wherein the plurality of optical surfaces comprise at least 8 optical surfaces, and each of the 8 optical surfaces comprises at least one correction mechanism that at least partially corrects the aberration.

11. The objective of claim 1, wherein:

a component of the aberration is confined to a first volume element in the refractive optical element;

at least one correction mechanism is determined such that it at least partially corrects the component of the aberration; and the at least one correction mechanism is in a second volume element that is conjugate with the first volume element.

12. The objective of claim 1, wherein the plurality of optical surfaces have conjugate surfaces arranged in the volume of the refractive optical element, and the conjugate surfaces are spaced apart by less than 5 mm in a direction parallel to an optical axis of the objective.

13. The objective of claim 1, wherein the plurality of optical surfaces have conjugate surfaces arranged in the volume of the refractive optical element, and the conjugate surfaces are spaced apart by less than 2.5 mm in a direction parallel to an optical axis of the objective.

14. The objective of claim 1, wherein the material related optical property is the refractive index.

15. The objective of claim 14, wherein at least one of the plurality of optical surfaces comprises a correction mechanism formed by a non-axisymmetric deformation of the at least one optical surface, and the non-axisymmetric deformation is configured to correct a wavefront deformation associated with the aberration.

16. The objective of claim 15, wherein the non-axisymmetric deformation comprises a material applied to the at least one surface and/or a region of the optical surface having material was ablated therefrom.

17. The objective of claim 1, wherein the material related optical property is the birefringence.

18. The objective of claim 17, wherein at least one correction mechanism modifies the polarization state of light passing through it.

19. The objective of claim 18, wherein the at least one correction mechanism comprises structures comprising a birefringent material.

20. The objective of claim 19, wherein at least one optical surface comprises the structures, and the structures comprise layers or plates having thicknesses that vary locally over the at least one optical surface.

21. The objective of claim 20, wherein the structures comprise form-birefringent structures.

22. The objective of claim 1, wherein the material related optical property is the degree of absorption.

23. The objective of claim 22, wherein at least one optical surface comprises a correction mechanism formed by a portion of the at least one optical surface having a locally varying transmissivity or reflectivity, or by a volume adjacent to the at least one optical surface having a locally varying transmissivity or reflectivity.

24. The objective of claim 1, wherein the material related optical property is an amount of scattering light.

25. The objective of claim 24, wherein at least one optical surface comprises a correction mechanism formed by a portion of the at least one optical surface that has a locally varying scattering effect, or by a volume adjacent to the at least one optical surface that has a locally varying scattering effect.

26. The objective of claim 1, wherein at least two of the plurality of optical surfaces are separated by at least one optical element which does not correct the aberration.

27. The objective of claim 1, wherein the objective has N intermediate image surfaces and N+1 pupil surfaces, and N is an integer having a value of zero or greater.

28. The objective of claim 27, wherein at least two of the plurality of optical surfaces are separated by k intermediate image surfaces, and k is an integer having a value of at least zero and at most N.

29. The objective of claim 1, wherein the refractive optical element consists of a fluoride, a chloride or an oxide.

30. The objective of claim 1, further comprising at least 2 plane-parallel plates on which the plurality of optical surfaces are formed.

31. The objective of claim 30, wherein the at least 2 plane-parallel plates have different thicknesses.

32. The objective of claim 1, further comprising at least 6 plane-parallel plates on which the plurality of optical surfaces are formed.

33. The objective of any of claim 30, wherein at least one plane-parallel plate is displaceable along an optical axis of the objective.

34. The objective of any of claim 30, wherein at least one plane-parallel plate is exchangeably received in an exchange holder.

35. The objective of claim 1, wherein the ratio R differs in the first and second planes by less than 5%.

36. The objective of claim 35, wherein the ratio R differs in the first and second planes by less than 2%.

37. The objective of claim 1 wherein:
a transmission contrast $C_t$ of more than 30% is obtained when an object is incoherently imaged into the volume of the plurality of optical surfaces that is conjugate with the volume of the refractive optical element;
the object is in the refractive optical element; and
the object has a spatial frequency $F_s$ of 0.5 Lp/mm.

38. An objective, comprising:
a refractive optical element having a birefringence that varies over a volume of the element, variations of the birefringence of the refractive optical element causing an aberration during use of the objective; and
at least two transparent optical correction elements, wherein:
at least a portion of each of the at least two transparent optical correction elements is arranged in a volume which is optically conjugate with the volume of the refractive optical element;
each of the at least two transparent optical correction elements comprises at least one correction mechanism that at least partially corrects the aberration and modifies the polarization state of light passing through it; and
the objective is configured to be used in a microlithographic projection exposure apparatus,
wherein the at least one correction mechanism is located in or intersects a first plane perpendicular to an optical axis of the objective, the first plane is conjugate with a second plane perpendicular to the optical axis, and the second plane intersects the volume of the refractive optical element, and
wherein a ratio R=Dp/Dm is at least substantially the same in the first and second planes, where:
Dp is a distance between a principal ray, which emerges from a point on a border of a field which is imaged by the objective, and the optical axis; and
Dm is a distance between a marginal ray, which emerges from a point on the optical axis in the field which is imaged by the objective, and the optical axis.

39. An apparatus, comprising:
an illumination system; and
the objective of claim 1,
wherein the apparatus is a microlithographic projection exposure apparatus.

40. A method, comprising:
manufacturing a microstructured component using a microlithographic projection exposure apparatus, the microlithographic projection exposure apparatus, comprising:
an illumination system; and
the objective of claim 1.

41. The objective of claim 38, wherein the refractive optical element has an index of refraction greater than 1.6 at a wavelength of 193 nm.

42. The objective of claim 37, wherein $F_s$ is 1.0 Lp/mm.

43. The projection objective of claim 1, wherein the refractive optical element comprises $CaF_2$.

44. The apparatus of claim 39, wherein the refractive optical element comprises $CaF_2$.

45. The objective of claim 38, wherein the refractive optical element comprises $CaF_2$.

46. A projection objective comprising:
a refractive optical element having a volume and a material related optical property that varies over the volume, and
a plurality of optical surfaces that are arranged in a volume that is optically conjugate with the volume of the refractive optical element,
wherein:
variations of the material related optical property of the refractive index refractive optical element cause an aberration during use of the projection objective;
each of the plurality of optical surfaces comprises at least one correction mechanism that at least partially corrects the aberration;
the projection objective is configured to be used in a microlithographic projection exposure apparatus;
the material related optical property is the degree of absorption; and
at least one optical surface comprises a correction mechanism formed by a portion of the at least one optical surface having a locally varying transmissivity or reflectivity, or by a volume adjacent to the at least one optical surface having a locally varying transmissivity or reflectivity.

47. A projection objective comprising:
a refractive optical element having a volume and a material related optical property that varies over the volume, and
a plurality of optical surfaces that are arranged in a volume that is optically conjugate with the volume of the refractive optical element,
wherein:
variations of the material related optical property of the refractive index refractive optical element cause an aberration during use of the projection objective;
each of the plurality of optical surfaces comprises at least one correction mechanism that at least partially corrects the aberration;
the projection objective is configured to be used in a microlithographic projection exposure apparatus;
a transmission contrast $C_t$ of more than 30% is obtained when an object is incoherently imaged into the volume of the plurality of optical surfaces that is conjugate with the volume of the refractive optical element;
the object is in the refractive optical element; and
the object has a spatial frequency $F_s$ of 0.5 Lp/mm.

* * * * *

UNITED STATES PATENT AND TRADEMARK OFFICE
CERTIFICATE OF CORRECTION

PATENT NO. : 7,982,969 B2
APPLICATION NO. : 12/330980
DATED : July 19, 2011
INVENTOR(S) : Karl-Heinz Schuster et al.

It is certified that error appears in the above-identified patent and that said Letters Patent is hereby corrected as shown below:

Title page, Other Publications, Column 2, Line 1, delete "ĕy" insert --ў--.

Page 2, Other Publications, Column 2, Line 3, delete "pet/." insert --pct/.--.

Sheet 3 of 9, Fig. 4, delete "160c" insert --160d--.

Column 1, Line 45, after "can" insert --be--.

Column 2, Line 63, delete "are" insert --is--.

Column 6, Line 2, delete "ore" insert --or--.

Column 6, Line 10, after "OF" insert --THE--.

Column 9, Line 8, delete "$I_{mn}$)" insert --$I_{min}$)--.

Column 10, Line 39, delete "4." insert --4--.

Column 11, Line 29, delete "2." insert --2--.

Column 14, Line 41, delete " $y, \bar{y}$ " insert --y, ў--.

Column 16, Line 65, Claim 33, before "claim" delete "any of".

Column 17, Line 1, Claim 34, before "claim" delete "any of".

Signed and Sealed this
Tenth Day of July, 2012

David J. Kappos
*Director of the United States Patent and Trademark Office*